United States Patent [19]
Takayama et al.

[11] Patent Number: 5,968,612
[45] Date of Patent: Oct. 19, 1999

[54] METHOD FOR THE PREPARATION OF SILICON COMPOUND THIN FILM

[75] Inventors: Suguru Takayama, Chiba; Michio Arai, Tokyo, both of Japan

[73] Assignee: TDK Corporation, Tokyo, Japan

[21] Appl. No.: 09/088,682

[22] Filed: Jun. 2, 1998

[30] Foreign Application Priority Data

Jun. 13, 1997 [JP] Japan .................................. 9-172885

[51] Int. Cl.⁶ ...................................................... H05H 1/24
[52] U.S. Cl. ............... 427/579; 427/249.15; 427/255.29; 427/255.394; 427/578

[58] Field of Search ...................................... 427/578, 579, 427/255.29, 249.15, 255.394

*Primary Examiner*—Bernard Pianalto
*Attorney, Agent, or Firm*—Oblon, Spivak, McClelland, Maier & Neustadt, P.C.

[57] ABSTRACT

The invention provides a method for preparing a silicon thin film at a high deposition rate or a silicon compound thin film having a high dielectric strength and high hardness, without causing damage to other structure films or forming flakes during film deposition. The method for preparing a silicon or silicon compound thin film involves evaporating a material by means of a high density plasma gun, and depositing a thin film of silicon or silicon compound on a substrate.

8 Claims, 2 Drawing Sheets

METHOD FOR THE PREPARATION OF SILICON COMPOUND THIN FILM

BACKGROUND OF THE INVENTION

1. Technical Field

This invention relates to a method for preparing functional thin films and the thin films, and more particularly, to a method for preparing silicon or silicon compound thin films for use in TFT, solar batteries, magnetic heads and thermal heads, and the silicon or silicon compound thin films obtained thereby.

2. Background Art

In the recent years, semiconductor products using silicon are more diversified. A variety of products were developed and have been used in practice. Among others, applied products of silicon or silicon compound thin films draw engineers' attention as being applicable to thin film transistors (TFT), charge transfer devices (CCD), solar batteries, organic EL devices, magnetic heads and thermal heads.

Of the applied products of silicon or silicon compound thin films, thin film transistors (TFT) utilizing α-Si enjoy a rapidly increasing demand in these years as a display for portable personal computers. Also, CCD is widely applied to video cameras, electronic cameras, and various optical equipment, and the demand therefor is rapidly increasing. Solar batteries using α-Si thin film as a substrate draw attention as a clean energy source because energy and resource saving problems are of great interest. On the other hand, magnetic heads and thermal heads for which the application of silicon compound thin films, especially as protective films, is expected are used especially in computer storages and output devices, and the demand therefor is also increasing. Further, research works are made on organic EL devices which are expected to find widespread applications as a self light-emitting display device, and some have been used in practice. The application of silicon compound thin films to the protective film or sealing film of organic EL devices has been investigated.

Widely used among the methods of depositing silicon or silicon compound thin films is an evaporation method using a CVD process. However, when TFT or similar products are formed using the CVD process, a film deposition rate in excess of 5 to 20 nm/min gives rise to problems including the abnormal growth of film with accompanying flakes or the damage to other films in the structure. Thus the film deposition rate is, in fact, restricted to the above-mentioned value. Since the restriction of the film deposition rate reduces mass productivity, there is a desire to have a film deposition technique capable of accommodating the recent rapidly increasing demand.

SUMMARY OF THE INVENTION

An object of the present invention is to provide a method for preparing a silicon thin film at a high deposition rate or a silicon compound thin film having a high dielectric strength and high hardness, without causing damage to other structure films or generating flakes during film deposition; and to provide the silicon or silicon compound thin film obtained by that method.

Specifically, the above object is achieved by the following construction.

(1) A method for preparing a silicon or silicon compound thin film comprising the steps of:

evaporating a material by means of a high density plasma gun, and depositing a thin film of silicon or silicon compound on a substrate.

(2) A method for preparing a silicon or silicon compound thin film according to (1) wherein a rate of film deposition is at least 50 nm/min.

(3) A method for preparing a silicon or silicon compound thin film according to (1) or (2) wherein the high density plasma gun is a graded pressure type plasma gun, a plasma is induced in an evaporation source by a means for generating a plasma-inducing magnetic field disposed in proximity to the evaporation source whereby the material is evaporated.

(4) A method for preparing a silicon or silicon compound thin film according to any one of (1) to (3) wherein said silicon or silicon compound is selected from silicon, silicon oxide, silicon nitride and silicon carbide.

(5) A method for preparing a silicon or silicon compound thin film according to any one of (1) to (4) wherein a reactive gas is introduced during film deposition.

(6) A silicon or silicon compound thin film which has been prepared by a method for preparing a silicon or silicon compound thin film according to any one of (1) to (5).

(7) A silicon or silicon compound thin film according to (6) wherein the silicon thin film is of amorphous silicon or polycrystalline silicon and has an oxygen content of up to $1 \times 10^{19}$ atom/cm$^3$.

(8) A silicon or silicon compound thin film according to (6) wherein said silicon compound thin film is of silicon oxide and has a dielectric strength of at least $1 \times 10^5$ V/cm.

(9) A silicon or silicon compound thin film according to (6) wherein said silicon compound thin film is of silicon nitride or silicon carbide and has a Vickers hardness of at least 1,000 kg/cm$^2$.

Meanwhile, TECHNICAL REPORT OF IECE, EID96-58 (1996-11) describes an ion plating method (URT-IP method) using a graded pressure type plasma gun capable of creating a high density plasma, with a beam correcting device added thereto. It is described that the use of this deposition method enables uniform film deposition over a large area substrate and high-speed high-potential film deposition.

However, the thin films which are attempted to deposit in this literature are only transparent ITO electrodes, and the deposition of silicon or silicon compound thin films using a high density plasma gun has never been investigated.

DESCRIPTION OF THE PREFERRED EMBODIMENTS

Figure 1:
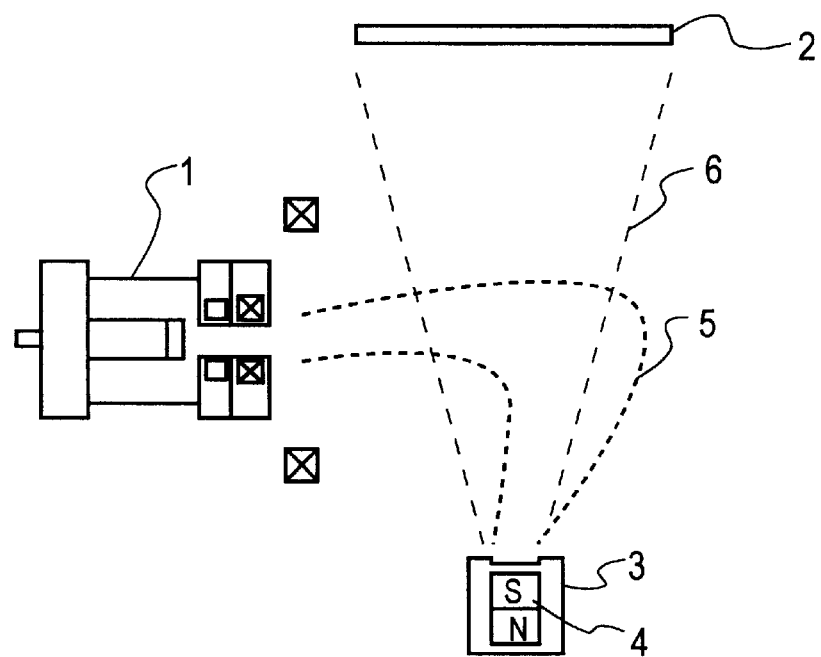
FIG. 1 is a schematic view showing the basic construction of a film depositing apparatus used in the invention.

The method for preparing a silicon or silicon compound thin film according to the invention involves evaporating a material by means of a high density plasma gun, and depositing a thin film of silicon or silicon compound on a substrate. The use of a high density plasma gun eliminates a need for ionization means such as a high-frequency coil, enables film deposition under clean conditions, accommodates for large area substrates, and ensures a high rate of film deposition.

The plasma gun for creating a plasma beam for use in the evaporation of a material is not critical as long as it can generate a plasma beam having the predetermined density. Various types of plasma guns are contemplated, with preference being given to a graded pressure type plasma gun as described in above-referred TECHNICAL REPORT OF IEICE, EID96-58 (1996-11). Since the graded pressure type plasma gun uses a dc arc discharge and maintains the pressure of a negative electrode higher than the pressure of a film deposition chamber, it advantageously ensures stable operation upon introduction of various reactive gases and a higher rate of film deposition than conventional sputtering processes. The plasma beam produced by the high density plasma gun preferably has an electron density of about $1 \times 10^{11}$ to $20 \times 10^{11}$ cm$^{-3}$, especially about $5 \times 10^{11}$ to $10 \times 10^{11}$ cm$^{-3}$. The shape of the beam can be controlled by a magnetic field.

The thin film thus deposited is a thin film of silicon or a silicon compound. Preferred as the silicon are amorphous silicon and polycrystalline silicon. Preferred silicon compounds are silicon oxide, silicon nitride and silicon carbide, especially $SiO_x$ wherein x is from 0.5 to 2.2, $SiN_y$ wherein y is from 0.8 to 1.8, and $SiC_z$ wherein z is from 0.5 to 1.5, and $SiO_xN_yC_z$ wherein x is from 0.2 to 0.7, y is from 0.05 to 0.4 and z is from 0.05 to 0.4. To obtain such silicon compounds, a silicon or silicon compound material may be used. Alternatively, a silicon compound can also be obtained by introducing a reactive gas serving as an oxygen, nitrogen or carbon source during film deposition.

The material used as the evaporation source includes silicon tablets, $Si_3N_4$, SiC, $SiO_2$ or composite materials thereof, with the silicon tablets being preferred. The reactive gas is, for example, $O_2$, $O_3$ or the like as the oxygen source, $N_2$ or the like as the nitrogen source, and $CH_4$ or the like as the carbon source. Also useful are CO, $CO_2$, $C_2H_4$, $C_2H_6$, $C_3H_8$, $C_6H_6$, $H_2O$, $NH_3$, $SiH_4$, and NOx such as NO, $NO_2$, and $N_2O$. When silicon thin films are formed, a doping gas such as $H_2$, $PH_3$ and $B_2H_6$ may be added as an impurity.

As to the film depositing conditions, the film depositing chamber is preferably maintained in a high vacuum of up to about $1 \times 10^{-2}$ Torr, more preferably up to about $1 \times 10^{-3}$ Torr, especially about $1 \times 10^{-3}$ to about $1 \times 10^{-4}$ Torr. Such a high vacuum is preferable since it is especially suited in the application of forming a Si thin film. An oxygen concentration in excess of $1 \times 10^{19}$ atom/cm$^3$ makes it difficult to generate a plasma. The preferred discharge current through the plasma gun, which varies with a particular type of plasma gun used, is usually about 10 to 150 A, especially about 50 to 100 A in the case of a graded pressure type plasma gun. The rate of film deposition is preferably at least 30 nm/min, more preferably at least 50 nm/min, especially about 50 to 150 nm/min.

Next, a film depositing apparatus for use in the practice of the invention is described.

FIG. 1 is a schematic view showing the fundamental construction of a film depositing apparatus used in the practice of the invention. The film depositing apparatus used in the practice of the invention includes a high density plasma gun 1, a substrate 2, an evaporation source 3, and a magnetic guide field generating means 4.

The high density plasma gun 1 is capable of generating high density plasma beams by a dc arc discharge or the like as described above, and is provided with a magnetic field generating means such as a steering coil for restricting the flow direction of the plasma generated. The plasma gun 1 emits plasma beams 5 which are guided by the magnetic field produced by the magnetic guide field generating means 4 and struck to the evaporation source 3. The evaporation source 3 has received therein an evaporation material capable of converting into silicon or the above-described silicon compound, which is evaporated and ionized by the irradIation of plasma beams 5 whereupon evaporated particles 6 deposit on the substrate 2 to form a thin film thereon.

Figure 2:
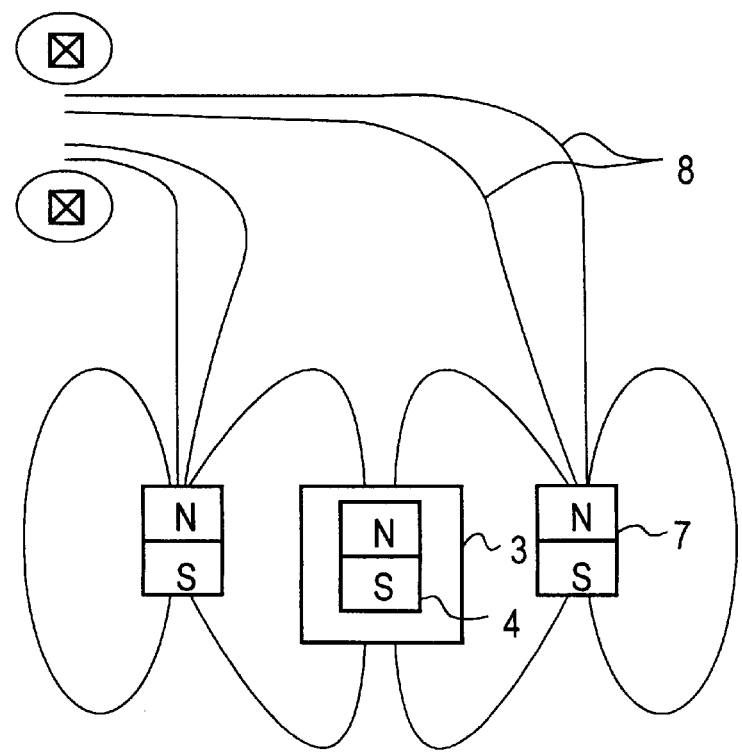
FIG. 2 is a schematic view showing one exemplary construction having a means for generating a correcting magnetic field for correcting the torsion of a plasma beam.

It is noted that although in the apparatus shown in FIG. 1, plasma beams 5 are guided by the magnetic guide field generating means 4 and irradiated to the evaporation source 3, there is a likelihood that plasma beams 5 are twisted by the self magnetic field produced by beam current, whereby the scattering direction of evaporated particles is deviated from upright so that the thin film deposited on the substrate 2 may have a locally varying thickness distribution. In such an event, a correcting magnetic field generating means 7 of annular shape may be disposed so as to surround the evaporation source 3 as shown in FIG. 2 whereby a magnetic field 8 generated thereby captures the plasma beams for correcting the torsion thereof.

The silicon thin film prepared by the method of the invention can be produced in the above-described high vacuum and preferably has an oxygen content of up to about $1 \times 10^{19}$ atom/cm$^3$, especially up to about $5 \times 10^{18}$ atom/cm$^3$. The lower limit of the oxygen content can be the limit of detection by SIMS.

Also, provided that amorphous silicon is one having a grain size of less than 5 nm, in the case of polycrystalline silicon, its grain size is preferably at least 5nm, especially 20 to 200 nm, and it preferably has a crystalline phase having an orientation plane of (111). In the case of amorphous silicon, its grain size is preferably up to 5 nm. Of the silicon thin films, an amorphous silicon layer preferably has a thickness of about 10 to 200 nm when it is used in TFT and about 500 to 1,500 nm when used in solar batteries. Further, a polycrystalline silicon layer preferably has a thickness of about 10 to 200 gm when used in TFT and about 1 to 20 $\mu$m when used in solar batteries.

Furthermore, the silicon compound thin films prepared by the method of the invention are preferably of silicon oxide, silicon nitride and silicon carbide. In particular, $SiO_x$ thin films are highly insulating, and preferably an insulating property of at least $1 \times 10^5$ V/cm, especially at least $1 \times 10^6$ V/cm is obtained. Its upper limit is usually about $1 \times 10^8$ V/cm. Also in particular, $SiN_y$ and $SiC_z$ thin films have a high hardness, specifically a Vickers hardness of at least 1,000 kg/cm$^2$, more preferably at least 2,000 kg/cm$^2$, especially at least 2,500 kg/cm$^2$. Its upper limit is about 3,500 kg/cm$^2$. Accordingly, although the application of these silicon compounds is not limited, $SiO_x$ thin films are advantageously used as a sealing film on organic EL devices or an insulating layer on TFT; $SiN_y$ and $SiC_x$ thin films are advantageously used as a protective film on magnetic heads and thermal heads. The thickness of these silicon compound thin films is usually about 0.5 to 10 $\mu$m although it varies with the material on which film deposition is made or the type of silicon compound deposited.

EXAMPLE

Examples of the invention are given below by way of illustration.

Example 1

Preparation of Amorphous Silicon Thin Film

A film deposition chamber was evacuated to $5 \times 10^{-4}$ Torr.

A silicon tablet was used as the evaporating material. A current of 200 A was conducted through a high density plasma gun at a voltage of 70 V. $H_2$ gas was added in an amount of 1 SCCM as an impurity. A silicon thin film was deposited to 150nm on a glass substrate at a deposition rate of 100 nm/min. The substrate temperature was 150° C. and the plasma beam had an electron density of $2\times10^{11}$ cm$^3$. The resulting amorphous silicon thin film had an oxygen content of $2\times10^{18}$ atom/cm$^3$.

Preparation of TFT (1)

Between drain and source layers formed on a glass substrate in a predetermined pattern, an amorphous silicon layer was deposited in a predetermined pattern to 150 nm by the same procedure as above. Further, an insulating layer and a gate layer were deposited, followed by wiring to complete a TFT panel.

The TFT device thus obtained was measured for electric field mobility. An electric field mobility of 250 V·S/cm$^2$ was marked.

Example 2

Preparation of Solar Battery

On a PET film, aluminum was deposited to 400 $\mu$m and TiAg deposited to 5 $\mu$m, forming a back side electrode. Further, amorphous silicon layers were deposited on the Film in the order of n-i-p by the same procedure as in Example 1. Further, a predetermined insulating resin layer was screen printed thereon, and a transparent ITO electrode was formed in a predetermined pattern by sputtering. The thin film laminate was worked by laser trimming so as to produce a predetermined cell structure, on which an insulating resin was screen printed and a collector electrode of silver was screen printed. Subsequent laser bonding and laminate sealing yielded a solar battery module.

The solar battery module thus obtained was measured for Isc, Voc and FF at 50,000 lux from a xenon lamp approximate to AM1.5. It exhibited superior characteristics to conventional solar battery modules.

Example 3

Preparation of Polycrystalline Silicon Thin Film

A film deposition chamber was evacuated to $5\times10^{-4}$ Torr. A silicon tablet was used as the evaporating material. A current of 200 A was conducted through a high density plasma gun at a voltage of 70 V. $H_2$ gas was added in an amount of 1 SCCM as an impurity. A silicon thin film was deposited to 150 nm on a glass substrate at a deposition rate of 100 nm/min. The substrate temperature was 150° C. and the plasma beam had an electron density of $2\times10^{11}$ cm$^{-3}$.

The surface of the resulting silicon thin film was observed under a scanning electron microscope, finding a grain size of 5 $\mu$m or higher. Analysis by x-ray diffractometry showed an orientation plane of (111). The thin film had an oxygen content of $2\times10^{18}$ atom/cm$^3$.

Preparation of TFT (2)

Between drain and source layers formed on a glass substrate in a predetermined pattern, a composite silicon layer was deposited in a predetermined pattern to 150 nm by the same procedure as in Example 1. The substrate temperature was 150° C. and the plasma beam had an electron density of $5\times10^{11}$ cm$^{-3}$. Further, an insulating layer and a gate layer were deposited, followed by wiring to complete a TFT panel.

The TFT device thus obtained was measured for electric field mobility. An electric field mobility of 250 V·S/cm$^2$ was marked.

Example 4

Preparation of Silicon Oxide Thin Film

A film deposition chamber was evacuated to $5\times10^{-4}$ Torr.

A silicon tablet was used as the evaporating material. A current of 200 A was conducted through a high density plasma gun at a voltage of 70 V. $O_2$ gas was added in an amount of 5 SCCM as a reactive gas. A silicon oxide thin film was deposited to 150 nm on a silicon substrate at a deposition rate of 100 nm/min. The substrate temperature was 200° C. and the plasma beam had an electron density of $5\times10^{11}$ cm$^{-3}$.

The resulting silicon oxide thin film was examined for composition by EPMA, finding $SiO_x$ wherein x was equal to 2.01. The silicon oxide thin film was measured for insulation breakdown voltage, finding a dielectric strength of $1\times10^6$ V/cm.

Example 5

Preparation of Organic EL Device

A glass substrate having a patterned transparent ITO electrode (or hole injecting electrode) of 100 nm thick formed by sputtering was subjected to ultrasonic washing with neutral detergent, acetone and ethanol, pulled up from boiling ethanol, and dried. The surface was cleaned with UV/ozone. Thereafter, the substrate was secured by a holder in a vacuum evaporation chamber, which was evacuated to a vacuum of $1\times10^{-4}$ Pa or lower. 4, 4', 4"-tris (N-(3 methylphenyl)-N-phenylamino) triphenylamine (m-MTDATA) was evaporated at a deposition rate of 0.2 nm/sec to a thickness of 40 nm, forming a hole injecting layer. With the vacuum kept, N, N'-diphenyl-N, N'-m-tolyl-4, 4'-diamino-1, 1'-biphenyl (TPD) was evaporated at a deposition rate of 0.2 nm/sec to a thickness of 35 nm, forming a hole transporting layer. With the vacuum kept, tris (8-quinolinolato) aluminum (Alq3) was evaporated at a deposition rate of 0.2 nm/sec to a thickness of 50 nm, forming an electron injecting and transporting/light emitting layer. With the vacuum kept, this EL device structure-bearing substrate was transferred from the vacuum evaporation chamber to a sputtering apparatus where an AlLi electron injecting electrode (Li concentration: 7.2 at %) was deposited to a thickness of 50 nm under a sputtering pressure of 1.0 Pa. In this step, argon was used as the sputtering gas, the input power was 100 W, the target had a diameter of 4 inches, and the substrate-to-target distance was 90 mm. With the vacuum kept, the EL device-bearing substrate was transferred to a film deposition apparatus used in the present invention where a silicon oxide thin film ($SiO_x$ wherein x was 1.95) was deposited to 150 nm as in Example 3.

With a DC voltage applied across the thus obtained organic EL device, the device was continuously driven in a dry argon atmosphere at a constant current density of 10 mA/cm$^2$. Under 6.5 V, the device initially emitted green light (maximum emission wavelength λmax=530 nm) at 530 cd/m$^2$. The half life of luminance was 850 hours, and the drive voltage rise during the half-life period was 1.9 v. The development and growth of dark spots of a size in excess of 50 gm was not observed during the period, indicating satisfactory characteristics.

Example 6

Preparation of Silicon Nitride Thin Film

A film deposition chamber was evacuated to $5\times10^{-4}$ Torr.

A silicon tablet was used as the evaporating material. A current of 200 A was conducted through a high density plasma gun at a voltage of 70 V. $N_2$ gas was added in an amount of 5 SCCM as a reactive gas. A silicon nitride thin film was deposited to 150 nm on a silicon substrate at a deposition rate of 100 nm/min. The substrate temperature was 200° C. and the plasma beam had an electron density of $2 \times 10^{11}$ cm$^{-3}$.

The resulting silicon nitride thin film was examined for composition by EPMA, finding $SiN_y$ wherein y was equal to 1.3. The silicon nitride thin film was measured for Vickers hardness, finding a value of 2,000 kg/cm$^2$.

Example 7

Preparation of Silicon Carbide Thin Film

A film deposition chamber was evacuated to $5 \times 10^{-4}$ Torr. A silicon tablet was used as the evaporating material. A current of 200 A was conducted through a high density plasma gun at a voltage of 70 V. $CH_4$ gas was added in an amount of 5 SCCM as a reactive gas. A silicon carbide thin film was deposited to 150 nm on a silicon substrate at a deposition rate of 100 nm/min. The substrate temperature was 200°C. and the plasma beam had an electron density of $2 \times 10^{11}$ cm$^{-3}$.

The resulting silicon carbide thin film was examined for composition by EPMA, finding $SiC_z$ wherein z was equal to 0.95. The silicon carbide thin film was measured for Vickers hardness, finding a value of 2,000 kg/cm$^2$.

Example 8

Preparation of Thin Film Head (1)

Figure 3:
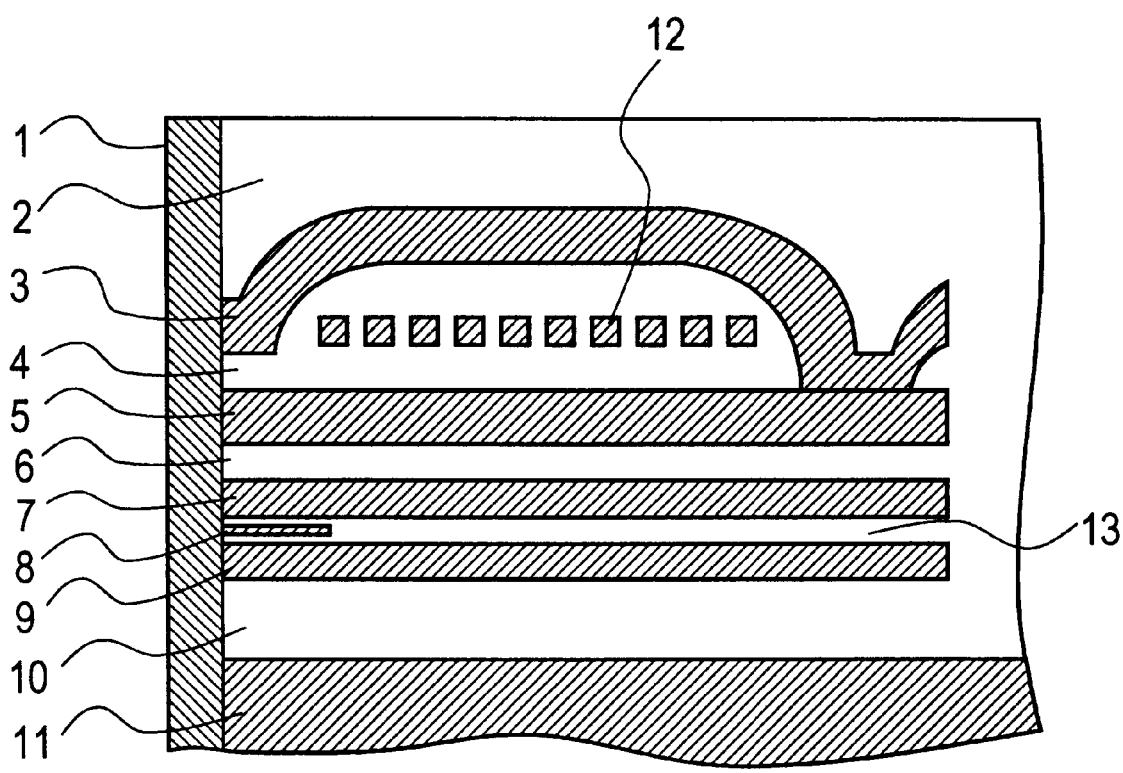
FIG. 3 is a schematic view showing one exemplary thin film head having a silicon compound thin film deposited according to the invention.

A thin film head of the construction shown in FIG. 3 was used. Specifically, the thin film head of the illustrated embodiment is a so-called MR/induction type hybrid head having a MR head section for reading and an induction head for writing. The induction head for writing is comprised of an upper magnetic pole layer 3, a lower magnetic pole layer 5, and a gap 4 and a coil 12 interposed therebetween. The MR head is comprised of an upper shield layer 7, a lower shield layer 9, and an insulating layer 13 and an MR element 8 interposed therebetween. In the illustrated embodiment, the induction head is disposed on the trailing side and the MR head disposed on the leading side.

A non-magnetic material such as alumina is used in a protective layer 2; a magnetically soft material such as Permalloy is used in the upper and lower magnetic pole layers 3 and 5; a magnetically soft material such as Permalloy, Sendust or iron nitride is used in the upper and lower shield layers 7 and 9; and a non-magnetic material such as alumina is used in a subbing layer 10.

On the sliding surface side of the thin film magnetic head that was opposed to a recording medium, a silicon nitride thin film ($SiN_y$ wherein y was equal to 1.1) was deposited to 10 nm as in Example 7. By a CSS test, the head was confirmed to ensure normal writing/reading even after $1 \times 10^6$ cycles.

Example 9

Preparation of Thin Film Head (2)

A thin film head was prepared as in Example 9 except that instead of the silicon nitride thin film in Example 9, a silicon carbide thin film ($SiC_z$ wherein z was equal to 0.8) was deposited to 10 nm as in Example 8. It was tested with equivalent results obtained.

Benefits

The invention provides a method for preparing a silicon thin film at a high deposition rate or a silicon compound thin film having a high dielectric strength and high hardness, without causing damage to other films within the structure or forming flakes during film deposition; as well as the silicon or silicon compound thin film obtained thereby.

We claim:

1. A method for preparing a silicon or silicon compound thin film comprising the steps of:

evaporating a material by means of a high density plasma gun, and depositing a thin film of silicon or silicon compound on a substrate.

2. A method for preparing a silicon or silicon compound thin film according to claim 1 wherein a rate of film deposition is at least 50 nm/min.

3. A method for preparing a silicon or silicon compound thin film according to claim 1 wherein the high density plasma gun is a graded pressure type plasma gun, a plasma is induced in an evaporation source by a means for generating a plasma-inducing magnetic field disposed in proximity to the evaporation source whereby the material is evaporated.

4. A method for preparing a silicon or silicon compound thin film according to claim 1 wherein a reactive gas is introduced during film deposition.

5. A method for preparing a silicon or silicon compound thin film according to claim 4 wherein said silicon compound thin film is of silicon nitride or silicon carbide and has a Vickers hardness of at least 1,000 kg/cm$^2$.

6. A method for preparing a silicon or silicon compound thin film according to claim 4 wherein said silicon thin film is of amorphous silicon or polycrystalline silicon and has an oxygen content of up to $1 \times 10^{19}$ atom/cm$^3$.

7. A method for preparing a silicon or silicon compound thin film according to claim 4 wherein said silicon compound thin film is of silicon oxide and has a dielectric strength of at least $1 \times 10^5$ V/cm.

8. A method for preparing a silicon or silicon compound thin film according to claim 1 wherein said silicon or silicon compound is selected from silicon, silicon oxide, silicon nitride and silicon carbide.

* * * * *

UNITED STATES PATENT AND TRADEMARK OFFICE
CERTIFICATE OF CORRECTION

PATENT NO. : 5,968,612
DATED : October 19, 1999
INVENTOR(S) : Suguru TAKAYAMA, et al.

It is certified that error appears in the above-identified patent and that said Letters Patent is hereby corrected as shown below:

On the title page: Item [54] and Col. line 1, line 3, should be

--[54] METHOD FOR THE PREPARATION OF SILICON
OR SILICON COMPOUND THIN FILM--

Signed and Sealed this

Twelfth Day of September, 2000

Attest:

Q. TODD DICKINSON

*Attesting Officer*   *Director of Patents and Trademarks*